United States Patent
Kanter

(10) Patent No.: US 8,917,197 B2
(45) Date of Patent: Dec. 23, 2014

(54) SYSTEM AND METHOD FOR IMPROVING PERFORMANCE OF PHOTONIC SAMPLERS

(71) Applicant: Gregory S. Kanter, Chicago, IL (US)

(72) Inventor: Gregory S. Kanter, Chicago, IL (US)

(73) Assignee: Nucript LLC, Evanston, IL (US)

( * ) Notice: Subject to any disclaimer, the term of this patent is extended or adjusted under 35 U.S.C. 154(b) by 166 days.

(21) Appl. No.: 13/733,669

(22) Filed: Jan. 3, 2013

(65) Prior Publication Data

US 2014/0185125 A1 Jul. 3, 2014

(51) Int. Cl.
| | |
|---|---|
| H03M 1/00 | (2006.01) |
| G02F 1/35 | (2006.01) |
| G02F 1/21 | (2006.01) |
| G02F 7/00 | (2006.01) |
| H03M 1/12 | (2006.01) |

(52) U.S. Cl.
CPC ............... *G02F 1/3517* (2013.01); *G02F 1/21* (2013.01); *G02F 7/00* (2013.01); *H03M 1/124* (2013.01); *G02F 2201/126* (2013.01)
USPC .......................................... 341/137; 341/155

(58) Field of Classification Search
CPC .... H03M 1/124; G02F 7/00; G02F 2201/126; G02F 1/3517
USPC ............................ 341/137, 155; 359/237, 245
See application file for complete search history.

(56) References Cited

U.S. PATENT DOCUMENTS

| | | | | |
|---|---|---|---|---|
| 6,850,543 | B2 * | 2/2005 | Cundiff et al. | 372/18 |
| 7,653,096 | B2 * | 1/2010 | Kawai | 372/22 |
| 8,289,837 | B2 * | 10/2012 | Kim et al. | 370/210 |
| 8,553,814 | B2 * | 10/2013 | Molina et al. | 375/344 |
| 8,818,541 | B2 * | 8/2014 | Villemoes et al. | 700/94 |

\* cited by examiner

*Primary Examiner* — Peguy Jean Pierre
(74) *Attorney, Agent, or Firm* — Nadya Reingand

(57) ABSTRACT

An interferometer used for modulating an optical signal with an electrical signal is described, where the optical signal can be subsequently detected so as to sample and digitize the electrical signal. Nonlinear optical elements can be located inside the interferometer to reduce the minimum detectable electrical input signal size. The interferometer can contain more than two arms to improve the tolerable dynamic range of the electrical signal. In some cases some outputs of the interferometer are dependent on the electrical input frequency while others have minimal frequency dependence, thereby allowing the frequency of the input electrical signal to be measured more easily. Ideally the modulator operates in a push-pull mode with a single electrode for the input electrical signal. Such a modulator can be constructed by using appropriate optical delay elements.

24 Claims, 6 Drawing Sheets

SYSTEM AND METHOD FOR IMPROVING PERFORMANCE OF PHOTONIC SAMPLERS

CROSS-REFERENCE TO RELATED APPLICATIONS

This patent claims priority to provisional application Ser. No. 61/582,579 filed Jan. 3, 2012 entitled "System and method for improving performance of photonic samplers.

FIELD OF THE INVENTION

The field of the invention is microwave photonics, including the modulation of photons with radio frequency signals and the use of photonics to aid in sampling and analog-to-digital conversion of radio frequency signals.

BACKGROUND

Analog-to-digital converters (ADCs) allow for an analog input signal to be sampled into the digital domain. Common uses for ADCs include instrumentation, such as oscilloscopes, medical imaging, communications, and radar.

Electronic ADC's have made steady technological progress, but issues such as clock jitter and internal parameter mismatches make it difficult for ADCs to maintain high resolution as the sampling rate increases. It is common for ADC resolution to fall 1 bit for every factor of 2 rate increase [1].

Photonic technology can be used to aid in creating faster ADCs. The performance improvement is due to various factors depending on the specific design, but may stem, for instance, from the ability to generate ultra-short pulses with ultra-low timing jitter in the optical domain. Twichell [2] used an optical modulator with two optical outputs, detected and digitized the two outputs, then applied an inverse transformation via a digital signal processor (DSP) to re-construct the voltage applied to the modulator. A common modulator to use is a dual-output Mach-Zehnder modulator which interferes two arms with a $\pi$ (180°) relative combining phase shift. A photonic sampling system described by Kanter [3] combines the interferometer arms with a 90° combining phase using an optical hybrid combiner also known as an in-phase quadrature-phase (I/Q) combiner. A variety of other optical samplers are known in the art [1].

In general one important performance issue with samplers are the requirements on the acceptable range the applied input signal. The applied signal size may be measured in volts or in dBm (decibels referenced to milliWatts). The dynamic range (DR) of a signal can be defined as the ratio of the largest acceptable input signal (with acceptable distortion) to the smallest measurable input signal. Ideally small signals can be measured and large signals can be tolerated leading to a large DR. Methods of having parallel ADCs have been proposed in order to increase the DR such as Rivera U.S. Pat. No. 5,111,202 (1992). U.S. Pat. No. 5,111,202 splits the input signal into multiple branches and sends it to multiple ADC units. The effective sensitivity and maximum acceptable input power of the multiple ADCs are different (one having a better sensitivity and one a higher maximum signal level), so by analyzing all the branches a higher overall DR can be achieved.

Optical samplers often use optical phase modulators to convert the input signal to be sampled from the electronic to the optical domain. In standard interferometric configurations phase modulators typically operate at input voltages less than the half-wave $V_\pi$ voltage (voltage required for a $\pi$ phase shift) because 180° combiners are $\pi$ periodic. This limits the maximum input signal, with the minimum signal limited by the smallest induced phase modulation that leads to a measureable signal. The I/Q hybrid technique can tolerate an input signal of up to $2 \cdot V_\pi$ and accomplishes this without reducing sensitivity and therefore can have a 2× larger DR. Optical modulators often have relatively high $V_\pi$ voltage levels. For instance, a phase modulator constructed from Lithium Niobate such as the Covega Mach-10 Phase modulator may have a $V_\pi$ of >3 volts, while an electrical sampler such as the National Semiconductor ADC12D1000 can have a much lower full scale input signal of ~0.6 V. Ideally the $V_\pi$ level would be smaller so that smaller signals can be observed thus improving signal sensitivity. Changing $V_\pi$ does not necessarily impact DR however, since both the minimum and the maximum tolerable signal changes in equal ratios. Regardless of the current state of the art, it is generally beneficial to lower the required signal size for a given level of performance as it makes the sampler more sensitive to the often small level signals that one may want to digitize and can either eliminate the need to amplify the electrical signal before sampling or at least reduce the output power or gain requirements of such an amplifier.

One technique that has been used in the art to allow a given electrical amplifier technology with a fixed maximum output voltage level to drive the high voltages required for optical modulators is to create push-pull modulators. Here dual phase modulators in different arms of an interferometer are driven to generate opposite phase shifts. This can be done for instance by using two separate phase modulators with input voltage signals of opposite polarity or by using domain inversion to allow a single voltage polarity to drive both modulators while still allowing for a push-pull action [4].

Nonlinear optical frequency conversion is used in various applications including for instance generating optical signals at a frequency of twice a given optical signal source, such as using an inexpensive infrared laser followed by a second harmonic generation harmonic generation (SHG) nonlinear crystal to generate green light. The process of SHG converts an electric field of $E_o e^{i\omega t + \phi}$ to $E_o' e^{i2\omega t + 2\phi}$, thereby doubling its angular frequency $\omega$ and likewise doubling the inherent phase. Other nonlinear effects like parametric amplification can also be used to perform useful functions such as phase conjugation [5].

Photonic ADCs are sometimes operated in an under-sampling regime, where the sampling rate is less than twice the highest input signal frequency. In such a regime the input signal frequency is not determined unambiguously using traditional sampling theory.

What is needed is a system or method to reduce the size of the required driving signal to modulate an optical signal in order to improve sensitivity to small electrical driving signals, ideally while preserving or extending the maximum tolerable input signal size and thereby also improving the dynamic range. A push-pull configuration is desirable since it can in some cases lower the required drive voltage. Some phase shift technologies cannot be easily configured to apply the opposite phase shifts needed in a push-pull configuration when the phase shifters are driven by the same voltage polarities, so it is useful if the push-pull configuration can operate without this requirement. In such a case the system can be realized with single-ended drive signals (no differential electrical amplifiers or baluns required) and without the additional fabrication step of poling. It is useful if the system can be operated as a sampler, and moreover if the sampler can identify the input signal frequency over a large frequency range even when operating in an under-sampling regime. Ideally the system should be able to operate at high input frequencies such as frequencies of 10's of GHz or higher. These benefits should be realized with a minimum amount of drawbacks such as increased size, weight, or power consumption.

SUMMARY

We describe an improved photonic modulation and sampling design. In some embodiments, nonlinear optical effects are used inside an optical modulator to reduce the required size of the input electrical signal drive voltage to the modulator in order to generate a fixed differential phase shift in an optical interferometer and thus a detectable optical modulation level in the optical modulator. The optical modulator can be an optical interferometer with nonlinear frequency converters in the arms of the interferometer. For instance, frequency converters such as second harmonic generation (SHG) conversion crystals which double the optical frequency in the interferometer can effectively reduce the voltage required for a given differential phase shift by a factor of ½. Another potential benefit of SHG can be allowing the use of optimized technology for the phase modulator versus the optoelectronic detectors, such as allowing the use of common lasers and phase modulators suited for 1550 nm modulation and common Silicon (Si) detectors suited for 775 nm detection. The Si detector technology is more compatible with integration with ADC electronic technology than detectors that are sensitive at 1550 nm. This is useful since some embodiments detect the optical outputs of the interferometer using photodetectors, the optical outputs being the outputs of an optical combiner that combine two arms of the interferometer, then sample and digitize the photodetector outputs in ADCs, and process the digitized ADC samples in a DSP in order to determine the input signal samples. In some embodiments both the original (fundamental) optical input frequency that is input to the interferometer and the generated second harmonic frequency can be detected at the interferometer outputs, with such a configuration allowing for an increased dynamic range since differential phase shifts of up to $2\pi$ can be unambiguously measured at the original optical input frequency but only differential phase shifts of up to $\pi$ can be unambiguously measured at the second harmonic optical frequency. The system can be operated in push-pull mode where one arm of the interferometer applies a phase shift of opposite sign to another arm thereby increasing the differential phase shift as defined by the phase difference between the interferometer arms at the output combiner, for instance by including a phase modulator in both arms of the interferometer with the phase modulators being driven by electrical signals of opposite polarity or by designing an electrode structure that generates a push-pull phase shift using a common hot (non-grounded) electrode.

Another embodiment uses parametric amplification to increase the effective modulation level of the optical signal in response to a fixed electrical input signal level. Here the pump beam of the parametric amplifier is phase modulated, and its phase modulation is transferred to the idler beam generated in the parametric amplifier with a factor of two increase in the phase modulation magnitude. Some embodiments include a push-pull design where the phase shift induced in one arm of the interferometer is opposite to that induced in the other arm. The opposite phase shift can be created at a given operating electrical input signal frequency even when using a single phase modulator to modulate a pump beam by modulating the pump beam in the phase modulator, splitting the modulated pump beam into two copies, sending each copy of the modulated pump to a different parametric amplifier, and controlling the arrival time of the pump beams at their respective parametric amplifiers by using optical delay elements. The optical delay elements are engineered so that at a nominal input electrical frequency the phase shifts generated in both interferometer arms approximately out-of-phase thereby generating a maximum differential phase shift, but at frequencies much lower than the nominal input electrical frequency the two arms will generate their modulations in-phase which will minimize the differential phase shift. In such a system the nonlinear parametric amplifier reduces the drive voltage by ½ (since the generated idler is phase modulated at twice the level of the pump phase modulation) and the push-pull effect reduces the drive voltage by ½ (at the nominal operating frequency where the delays are set such that the phase modulation induced in each arm of the interferometer are opposite at the optical output combiner of the interferometer), and therefore the drive voltage can be reduced by ¼. An SHG crystal can also be added to frequency double the generated idler and therefore reduce the drive voltage by an additional factor of ½. In addition to the parametric amplifiers traditional optical amplifiers can also be located in the interferometer in order to reduce the gain requirements of the parametric amplifier and therefore reduce the required peak pump power.

Another modulator embodiment can be made by the use of optical delay elements inside the interferometer, with one delay element located before the phase modulation in one arm of an interferometer and one delay element located after the phase modulation in the other arm of the interferometer. The overall optical delay in both the interferometer arms is kept the same, which allows short optical input pulses to interfere in the interferometer. However, the delay elements delay the phase modulation applied in one arm relative to the other which forms a push-pull interferometer at a nominal operating frequency where the phase modulation in each arm is out-of-phase (180°) at the optical output combiner. As the input frequency decreases below the nominal operating frequency the difference in phase between the modulation signals in each arm also decreases, so that for input frequencies approaching zero Hertz there is no differential phase shift. The differential phase shift is thus frequency dependent. The delay elements can be variable delay elements so that the nominal operating frequency can be changed, thereby tuning the nominal operating frequency of the modulator so the modulator can operate over a broader frequency range. A sampling system constructed with such a modulator can measure the digitized signal size and a control unit can adjust the variable delay elements so as to maximize the digitized signal size, thus configuring the system to operate close to the nominal operating frequency. The modulation response of the system at a given value of the optical delay elements is dependent on the frequency of the input electrical signal to be digitized.

In some embodiments additional interferometer arms can lead to increased dynamic range or new operating modes. For instance, the push-pull modulator that makes use of delay elements to create a modulation response that is frequency dependent can be modified to include a third arm such that some of the interferometer outputs are less frequency dependent, or ideally frequency independent over a large frequency range. In such a case samples from the frequency dependent and the frequency independent outputs can be digitized and their sizes compared in order to estimate the frequency of the electrical input signal. By combining the three or more interferometer arms in different ways, for instance two of the arms in a push-pull configuration and two of the arms in a single-ended configuration (with one arm being split into two so it can be combined with both other arms), some of the interferometer outputs can be made more sensitive to small voltage signals while other interferometer outputs can handle larger input signals, thus by monitoring both outputs larger input signals can be unambiguously measured without sacrificing sensitivity therefore improving dynamic range. In some cases the magnitude of the phase modulation applied by the push-pull phase modulators are unequal, with the push-pull arm containing the smaller magnitude modulation being combined with the push-pull arm containing the larger magnitude modulation in an optical combiner and also being combined with a third arm having a smaller magnitude modulation of ideally zero and typically less than ½ the size of the phase modulation in either of the push-pull arms, in another optical combiner. By measuring the various interferometer outputs (outputs of the optical combiners) a larger dynamic range can be obtained. If SHG elements are used in some but not all of the interferometer arms, some interferometer arms that have had their optical frequencies doubled can be combined in some optical combiners, while interferometer arms that have not had their optical frequencies doubled can be combined in other optical combiners. Measuring the outputs of the various optical combiners can then increase the overall dynamic range.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments. In general, features described in one embodiment might be suitable for use in other embodiments as would be apparent to those skilled in the art.

Figure 1:
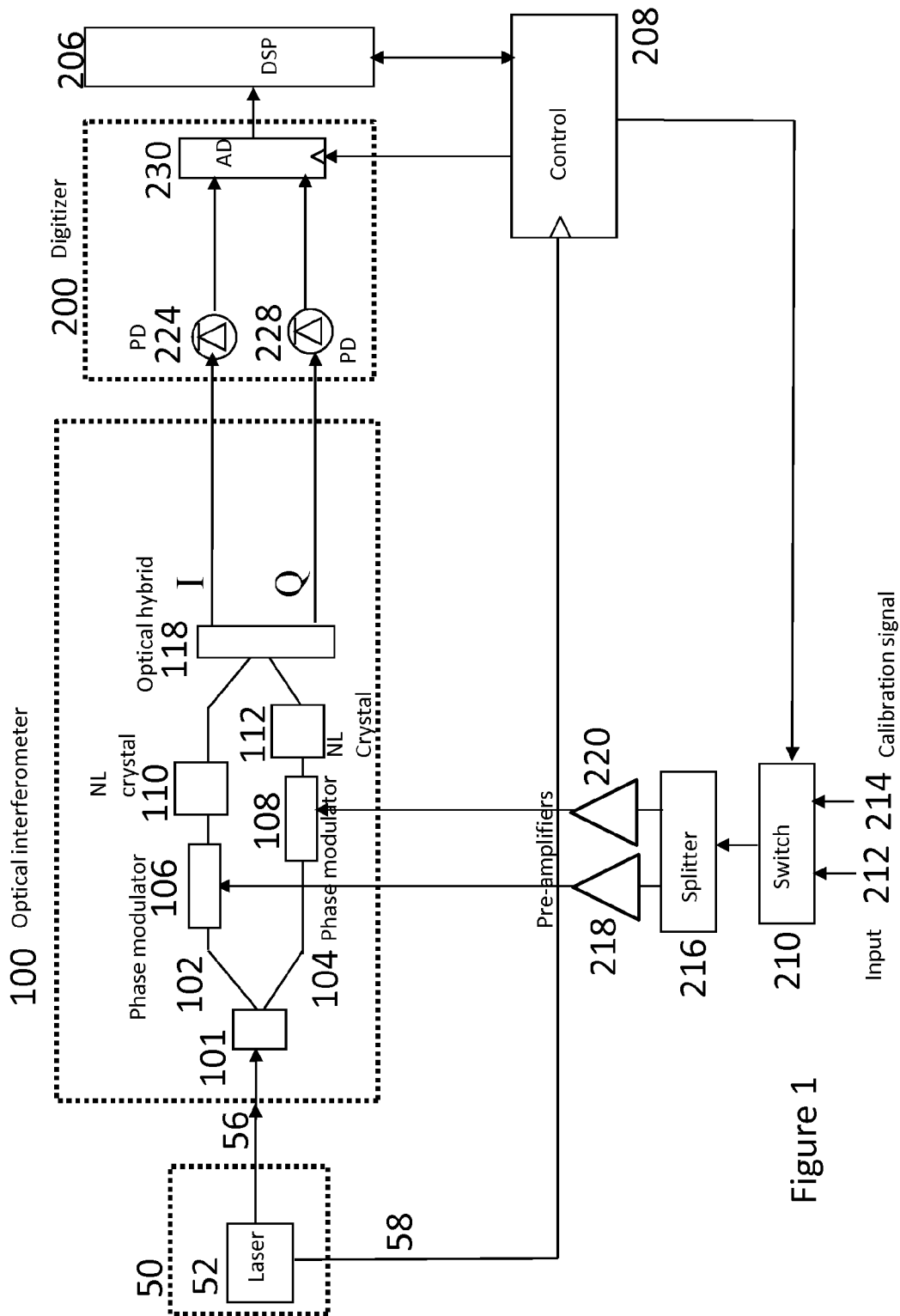
FIG. 1 Optical sampler using an optical modulator with SHG crystals in a push-pull configuration.

An embodiment of the invention is shown in FIG. 1. The system modulates an optical signal according to an input electrical signal, and the amplitude modulated optical outputs are measured in order to sample and digitize the input electrical signal. The system consists of an optical source 50, an optical interferometer 100, an optical signal digitization block 200, and a digital signal processing (DSP) unit 206. The optical interferometer modulates an optical signal with an electrical input signal 212. The optical source typically generates short optical pulses to sample the input signal at a particular time specified by the pulse location. The optical signal digitization block converts the modulated output optical pulses into digitized electrical samples. The DSP processes the digitized electrical samples to generate digitized samples of the input signal. A control unit 208 is used to coordinate the operation of the devices which can include distributing the clock at the sampling frequency and controlling which of multiple input signals are selected from an input selector switch 210, where the signals to the input selector switch can contain the signal to be digitized 212 or a calibration signal 214. In this embodiment the optical source is a pulsed mode locked fiber laser 52. An electrical clock output 58 from the optical source is at the sampling frequency which is the same as the optical source pulse repetition rate. Without loss of generality we assume a 1 GHz sampling rate for example. The optical output 56 of the optical source contains picosecond (ps) duration pulses at a 1 GHz repetition rate. The pulses are sent to an optical splitter 101 that splits the optical signal into two arms, the signal 104 and the reference 102 arms although in this case the signal and reference labels are arbitrary since both arms contain identical components. The phase modulators 106,108 are each driven with the electrical signal selected by the input selector switch 210, which is then split by an electrical splitter 216 and amplified in two electrical amplifiers 218,220 before driving the respective phase modulators. The electrical signal to both modulators is thus nominally the same, however the phase modulator 106 in the reference arm applies a phase shift of opposite direction to the phase modulator in the signal arm 108 in response to the input signal when the phase shifts are measured at the optical combiner 118. The differential induced phase shift is thus doubled. This push-pull modulation can be accomplished for instance by appropriately poling one of the phase modulators or by using one electrical amplifier with an inverting polarity and one with a non-inverting polarity or using an electrical balun as the electrical splitter. As such the optical phase shift applied in both arms are in opposite directions. After the phase modulators 106,108 are nonlinear harmonic generation crystals 110,112 that multiply the optical frequency and phase of the input optical signal by a multiple n. This can be realized for instance by periodically poled lithium niobate waveguides configured as second harmonic generation (SHG) crystals that frequency double (n=2) an input optical frequency of $2 \times 10^{14}$ Hz (about 1500 nm wavelength) into a new frequency of $4 \times 10^{14}$ Hz (about 750 nm). Note that the optical inputs to the SHG crystals are expected in this case to be a stream of optical pulses of constant power. Thus the conversion efficiency of the input optical pulses from the fundamental to the harmonic optical frequency for the SHG crystals can be both high and predicable. After the harmonic frequency conversion the phase shift applied by the phase modulators is effectively doubled. Since the interferometer is phase shifted in a push-pull configuration the voltage required to each phase modulator is halved in comparison to the case where there is just one phase modulator. Thus this configuration reduces the drive voltage to the modulators to ¼ the level it would otherwise be when using a single phase modulator in one arm of the interferometer without frequency conversion. This is equivalent to reducing the maximum required output power from the amplifiers by 12 dB.

Instead of a traditional electrical splitter, the electrical splitter could be of a balun type that splits the input signal into two arms with a 180° phase shift. In such a case the two phase modulators would not need to be oppositely poled. However, it is more difficult to make a balun operate over a wide frequency range than a simple 0° electrical splitter. The use of two separate amplifiers after the splitter helps to reduce the required saturation power of the amplifiers. The embodiment is implementable using discrete components, including two separately packaged modulators, although it could also be implemented such that the interferometer is in a single opto-electronic integrated circuit. If the interferometer is formed in an opto-electronic integrated circuit a push-pull phase shift can also be implemented using only a single hot input electrode. Such an implementation has advantages including a reduction of the number of amplifiers, although the implementation shown using two amplifiers will typically in practice require the smallest output saturation power per amplifier since the differential drive voltage is shared between the two amplifiers.

The optical output from the harmonic generation crystals are sent to an optical combiner 118 which can be realized by an optical I/Q hybrid combiner with the I and Q outputs being a combination of the optical signal from both interferometer arms, but with the combining phase between the two output arms being different by 90°. The optical hybrid combiner outputs are sent to the optical signal digitization block 200. Two photodetectors 224,228 convert the I/Q optical signals into an electrical signal that is digitized by a multi-channel electrical ADC 230. The sampled outputs of the ADC 230 are sent to a DSP unit 206 which calculates the applied differential phase shift between the two arms of the interferometer from the sampled I/Q signals, where the applied phase shift is directly related to the input electrical signal sent to the phase modulators. Thus the input signal is digitized. A calibration signal 214 can be selected by the input selector switch in order to drive the system with a known signal in order to allow the DSP unit to accurately determine the calibration parameters of the system if necessary. Alternatively the input signal itself can be used to self-calibrate. Note that the optical combiner may have additional outputs including outputs that are 180 degrees out of phase with the I and Q outputs. These additional optical outputs can also be detected either directly or by using balanced photo-detection. The use of such additional outputs may improve the signal quality as is known in the art. However, since they are not required for operation we omit them going forward for simplicity.

The optical frequency change after the harmonic generation crystals means that the optical components following the harmonic generation crystals must be compatible with the new optical frequency. In the case of doubling the optical frequency from $2 \times 10^{14}$ to $4 \times 10^{14}$ Hz, the optical-to-electrical detectors 224,228 can now be constructed of Silicon (Si) based materials, which is often less expensive and easier to integrate with other components like electronic devices. For instance the electronic ADC is likely to be built out of Si. It may thus be feasible to integrate the optical modulator 100 and the electrical signal digitization block 200 in the same opto-electronic circuit. In some cases, it is beneficial to use high optical power levels in order to optimize the effective number of bits (ENOB) that are obtainable in the sampling system. However, the photodetectors may saturate at high optical powers and therefore not be capable of improving ENOB beyond some inherent limit. This can be mitigated by optically splitting the optical combiner signal outputs into multiple copies and summing the detected copies from multiple detectors. Such a process is made easier by operating at a Si compatible wavelength where large scale integration is technologically easier. However, due to the importance of the telecommunications industry, many lasers and phase modulators are constructed to operate in the 1550 nm wavelength band. Thus an additional feature of the harmonic generator is to allow for different and more suitable technologies to be used on the optical generation/phase modulation side versus on the detection/digitization side.

Depending on the composition of the phase modulator, it may not be possible or not be easy to fabricate phase modulators of opposite polarity, although the design of FIG. 1 where the phase modulators are assumed to be poled to be of opposite polarity and thus directly apply opposite phase shifts for a given input driving voltage has the advantages of wide band operation and single-polarity electrical amplifiers.

The optical interferometer 100 of FIG. 1 is particularly sensitive to small input signals due to the inclusion of the SHG crystal. As such it could be used in various associated technologies, such as an analog photonic microwave link that sends a microwave signal over a fiber optical link. A typical use of the optical interferometer in a photonic microwave link would bias the modulator at a quadrature point (90 degree phase difference between the arms), change the I/Q 90° hybrid 118 to a standard 180° combiner, and subtract the signals from the two photodetectors 224,228 in order to generate an analog version of the input signal at a remote location. The remote location can be located far away from the optical combiner by using long fiber optical cable to connect the optical combiner outputs to the photodetectors, for instance fiber cable of 100's of meters. Such an application is a subset of the sampling applications described here since the optical interferometer and photodetectors are used similarly in both cases, but the additional ADC and DSP functionality is not required.

Figure 2:
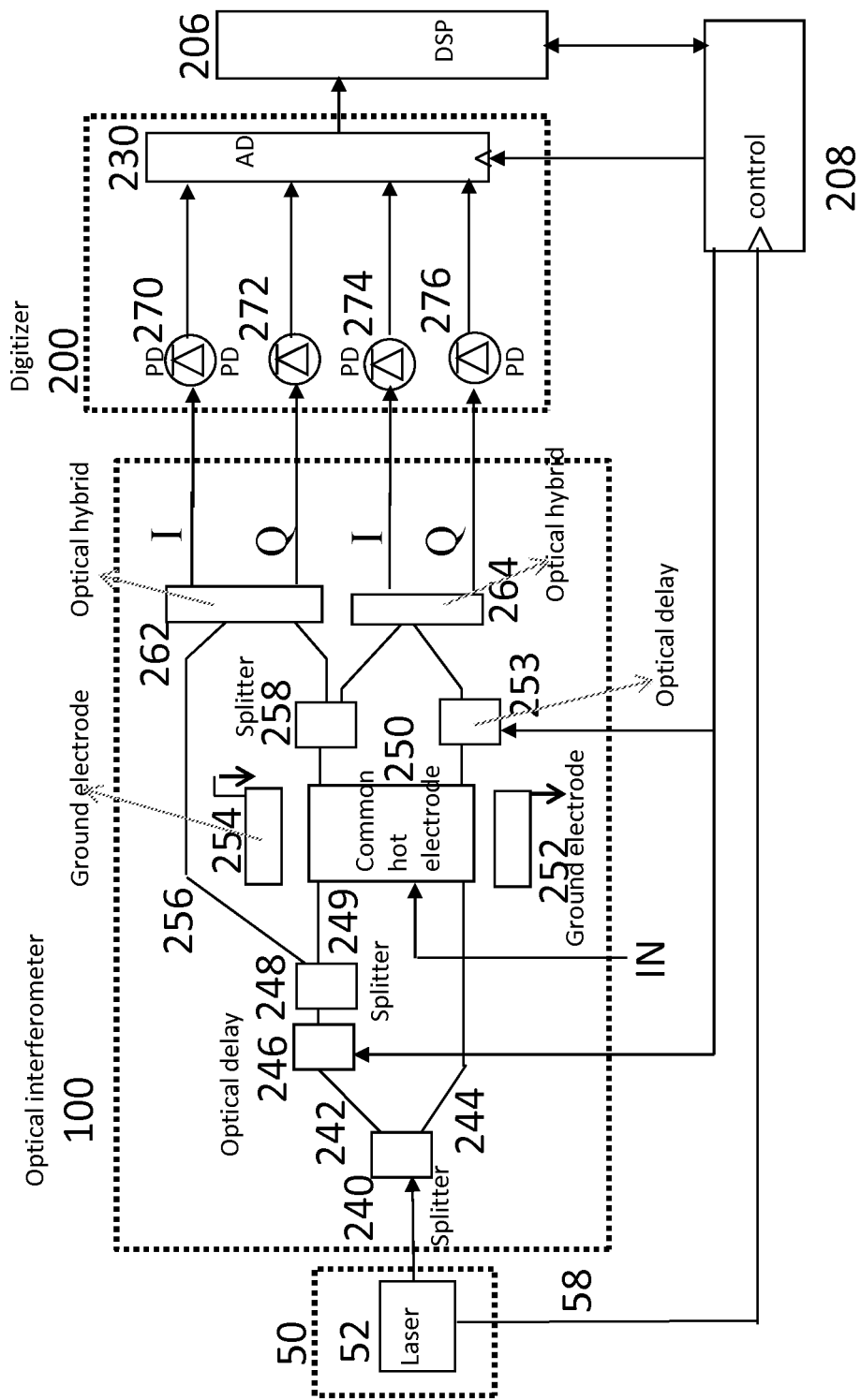
FIG. 2 Push-pull sampler configuration that uses variable optical delay elements to induce a push-pull effect maximized at a specific input frequency. A third interferometer arm is used to generate additional modulator outputs that improve the sampler dynamic range.

The embodiment of FIG. 2 is useful for measuring the frequency of an input signal that can vary over a large operating frequency and amplitude range, or for operating phase modulators at an input frequency that can vary over a large range even when the phase modulators cannot be poled or otherwise conveniently driven in a push-pull mode. Assuming a 1 GHz sample rate then according to standard sampling theory the input frequency can be measured unambiguously in a 500 MHz (½ the sample rate) range. If the input signal frequency can actually range to 100 GHz then in order to unambiguously measure the signal a 200 GHz sample rate would typically be needed, which is impractical. One advantage of the embodiment of FIG. 2 is that the signal frequency can be determined with a low probability of ambiguity even though the sample rate is much less than twice the maximum input frequency.

FIG. 2 shows an embodiment with some features similar to FIG. 1, with the same component labels being used for identical components. The first optical splitter 240 in the interferometer splits the input optical pulses into two push-pull arms 242,244. The splitting ratio can be 9:2 with $9/11^{ths}$ going to arm 242 and $2/11^{ths}$ going to arm 244. Arm 242 passes through a first variable optical delay element 246 to a second optical splitter 248 that splits ⅓ of the light to the upper arm 256 and sends ⅔ of the light to the lower arm 249 to be phase modulated. A common hot electrode 250 carries the input signal and modulates both push-pull arms. The two arms can alternatively be viewed as two different spatial modes being modulated by the same phase modulator with a single hot electrode 250. The interferometer can be integrated in an optical integrated circuit with both arms realized by optical waveguides and the waveguides of the push-pull arms being located close together so that a single electrode can modulate both of them. Both interferometer arms will experience the same phase modulation in response to the same electrical input signal at any given instant of time. Two grounded electrodes 254,252 and are also shown which carry the return signal of the traveling wave electrical signal (a termination resistor is not shown). The placement of the electrodes in the embodiment is chosen to convey that there is only one signal-carrying hot electrode that accepts the input signal. This is advantageous since the input signal to be modulated does not need to propagate through any additional circuitry like electrical baluns or electrical splitters. The closely spaced push-pull waveguides under the hot electrode 250 are phase modulated in the same direction in response to a given input signal. In practice the actual electrode design will vary based on many design factors, including the type of electro-optical material being used and the design of FIG. 2 is merely illustrative.

The optical pulse that travels through arm 244 arrives at the phase modulated portion of the interferometer earlier than the pulse that travels through arm 249 due to the optical delay element 246. Say the first variable optical delay element 246 causes a 5 ps delay between the pulse from arm 244 and the pulse from arm 249. Then at an input frequency sinusoid of 0.5/5 ps=100 GHz the pulse in arm 249 can arrive at the peak of the sinusoid while the pulse in arm 244 can arrive at the trough of the sinusoid (180° out-of-phase). Therefore a push-pull effect will cause the differential phase shifts be maximized at 100 GHz, and the exact amount of differential phase shift will be frequency dependent (the differential phase shift will approach zero at zero Hertz). The frequency at which the push-pull effect is maximized can be considered the nominal operating frequency, although the device can be effectively used over a broad range of frequencies. For a given input signal voltage swing, the size of the digitized input electrical signal will be frequency dependent and will be maximized at the nominal operating frequency. Typically the nominal operating frequency will be >10 GHz and more usually >50 GHz since one of the goals of the system is to maintain operation at high input frequencies that are difficult to digitize using electrical samplers. A second variable optical delay element 253 delays the pulse in arm 244 by 5 ps (assuming the path lengths from the initial splitter to the first optical combiner are matched other than due to the variable delay lines) so that the two pulses overlap in time at the first output hybrid combiner 264. The two interferometer arms that eventually reach the first hybrid combiner 264 input ports have the same overall optical path delay so that they interfere. Thus when the variable delay lines are changed they are both changed together so as to maintain a matching overall optical delay. Both variable optical delay elements are under the control of the controller 208 and set to have matching delay times.

The phase modulated pulse in arm 249 is split in a second optical splitter 258 with a 50/50 splitting ratio. Thus the intensities of the pulses arriving at the first output hybrid combiner are equal since arm 244 has a transmissivity of $2/11$ and the other arm into the first hybrid output combiner 264 has a transmissivity of $9/11 \cdot 2/3 \cdot 1/2 = 2/11$. Thus the two arms have the same pulse amplitude and maximally interfere at the output of the push-pull optical hybrid combiner 264.

A portion of the optical pulse in arm 242 is split by a third optical splitter 248 to a third interferometer arm 256. Arm 256 is combined with the phase modulated optical pulse from arm 249 in a single ended optical hybrid combiner 262. The first optical delay line is common to both these arms, so it has no effect on the pulse arrival times at the second optical hybrid combiner. The optical paths are thus designed so that both the paths from the second splitter 248 to the single ended optical hybrid combiner 262 have the same optical path length. Since arm 256 is un-modulated, the optical modulation at the single ended optical hybrid combiner 262 is not frequency dependent (it is frequency independent other than the natural frequency response of the phase modulator). The interferometer can be viewed as two interferometers, one that is push-pull whose modulation level is frequency dependent and one that is single ended whose modulation level is frequency independent. It is possible to put a small modulation level on the third interferometer arm instead of zero modulation as depicted here. Generally the small modulation level will be substantially smaller than the modulation in the push-pull arms, such as less than ½ the modulation level in either of the other two arms. If, for instance, the modulation level in arm 256 was equal to the modulation level in the push-pull arms then the single ended optical hybrid combiner would either see the same modulation as the differential optical hybrid combiner (if arm 256 and 249 apply opposite phase shifts in response to an input signal) or would see no modulation at any input frequency (if arm 256 and 249 apply identical phase shifts in response to an input signal). Leaving arm 256 un-modulated is particularly convenient since it simplifies device construction.

The optical delay lines are configured so that path lengths of the interferometer arms from the splitter 240 to their respective optical combiners are equal, which allows the short optical input pulses from the pulse optical source to interfere at the optical combiners.

Figure 3:
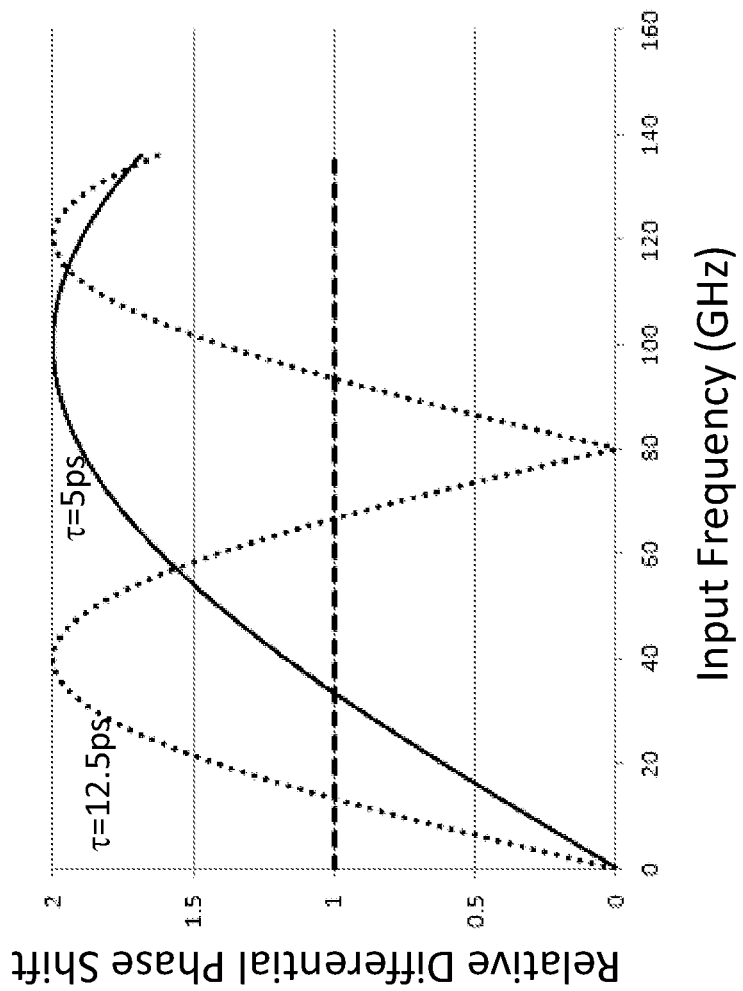
FIG. 3 Plot of the relative frequency response of the applied differential phase shift induced in the frequency dependent outputs of a narrow band push-pull system such as the system in FIG. 2 at two different values for the optical delay elements. In both cases the frequency response approaches zero as the input frequency approaches zero.

A plot of the relative applied differential phase shift (or relative phase modulation index) as a function of frequency is shown in FIG. 3. The single ended interferometer has a flat modulation index as a function of frequency (assuming the electro-optical bandwidth of the modulator is large). The push-pull interferometer with 5 ps relative delay has a modulation index that peaks at 100 GHz. The applied differential push-pull phase shift when a sinusoidal driving voltage is applied can be written as $\Delta\phi = \phi_1 \cdot \sin(\omega t) - \phi_1 \cdot \sin(\omega t + \delta)$, where the angular frequency $\omega = 2\pi f_e$, $2\phi_1$ is the peak-to-peak applied phase shift on one of the arms, t is time, $f_e$ is the input frequency of the electrical input signal, and $\delta = \omega^* \tau$ where $\tau$ is the optical delay in the first variable delay line. The ratio of the peak-to-peak phase shift in the push-pull arms measured at the push-pull optical combiner to phase shift in the frequency independent arms measured at the single ended hybrid combiner can be written as $r = 2^{0.5} \cdot \{(1 - \cos(\delta))\}^{0.5}$. The r value thus gives an indication of the input frequency provided $\tau$ is known. Since the single-ended phase shift is normalized to "1" in FIG. 3 the relative differential phase shift at the push-pull hybrid combiner is equivalent to r. Considering FIG. 3, we see if $\tau = 5$ ps and $r = 1.5$ then $f_e$ can be estimated as ~54 GHz. The exact value of $f_e$ can then be found by analyzing a sequence of signal samples using traditional sampling theory, which is very accurate even in noise, provided the initial frequency estimate is within ±250 MHz (500 MHz total range which is ½ of the sample rate) of the correct value. For frequencies near 100 GHz it may be difficult to attain such an accurate frequency estimate since the slope of the curve of r vs. frequency is flat for $\tau = 5$ ps. If the variable delay is changed to a different value then the slope near the 100 GHz operating frequency can be made larger. For instance, one can choose t=12.5 ps. Note that for small input frequencies <30 GHz a τ=12.5 ps will have a greater slope of r vs. f and thus have better frequency selectivity. This shows that different delay values can be advantageous when operating at different input frequencies.

The ability to change τ to 12.5 ps also extends the range of operation over which the delay-induced push-pull phase shift acts to improve the system sensitivity by having a larger differential phase shift for a fixed input signal size than the single-ended case. For frequencies between 14-57 GHz the τ=12.5 ps setting has higher phase modulation index than either the frequency independent arms or the τ=5 ps setting. More generally the variable delay line can be set to optimize r for any given input frequency and thus maximize the frequency range of operation. However, we choose just two discrete variable delay settings here as an example, and also because some variable delay methods that are easily integrated into an optical integrated circuit, such as the use of a cascaded 1×2 switch and a 2×1 switch with different waveguide lengths connecting the 1×2 switch outputs to the 2×1 switch inputs, may be easier to realize using discrete delay values. Note also that fixed delay lines could be substituted for variable delay lines thus reducing the system complexity, although such a system will operate well over some frequency band, for instance for t=12.5 ps from ~15-65 GHz. The ability to change the delay value allows this band to be tuned as desired.

We note that the embodiment of FIG. 2 also has an enhanced dynamic range. This occurs because the single ended optical combiner can operate without ambiguity over a full 2π phase shift on arm 249, while the push-pull optical combiner can operate without ambiguity over only a π phase shift on arm 249 (because arm 244 will have a −π phase shift). Thus the single ended combiner can handle twice as large of a signal. However, the push-pull combiner is sensitive to differential phase modulations that are smaller by a factor of two. Thus the dynamic range can be expanded by up to a factor of two. The I and Q optical hybrid outputs are detected by photodetectors 270,272,274,276 and digitized by a multi-channel ADC 230 before being sent to a DSP 206. The samples from the single ended optical combiner detected in photodetectors 270,272 are processed to determine one set of samples of the input signal while the samples from the push pull optical combiner detected in photodetectors 274,276 are processed to determine a second set of input signal samples. The DSP can compare the size of these two sample sets to estimate the frequency of the input signal.

Figure 4:
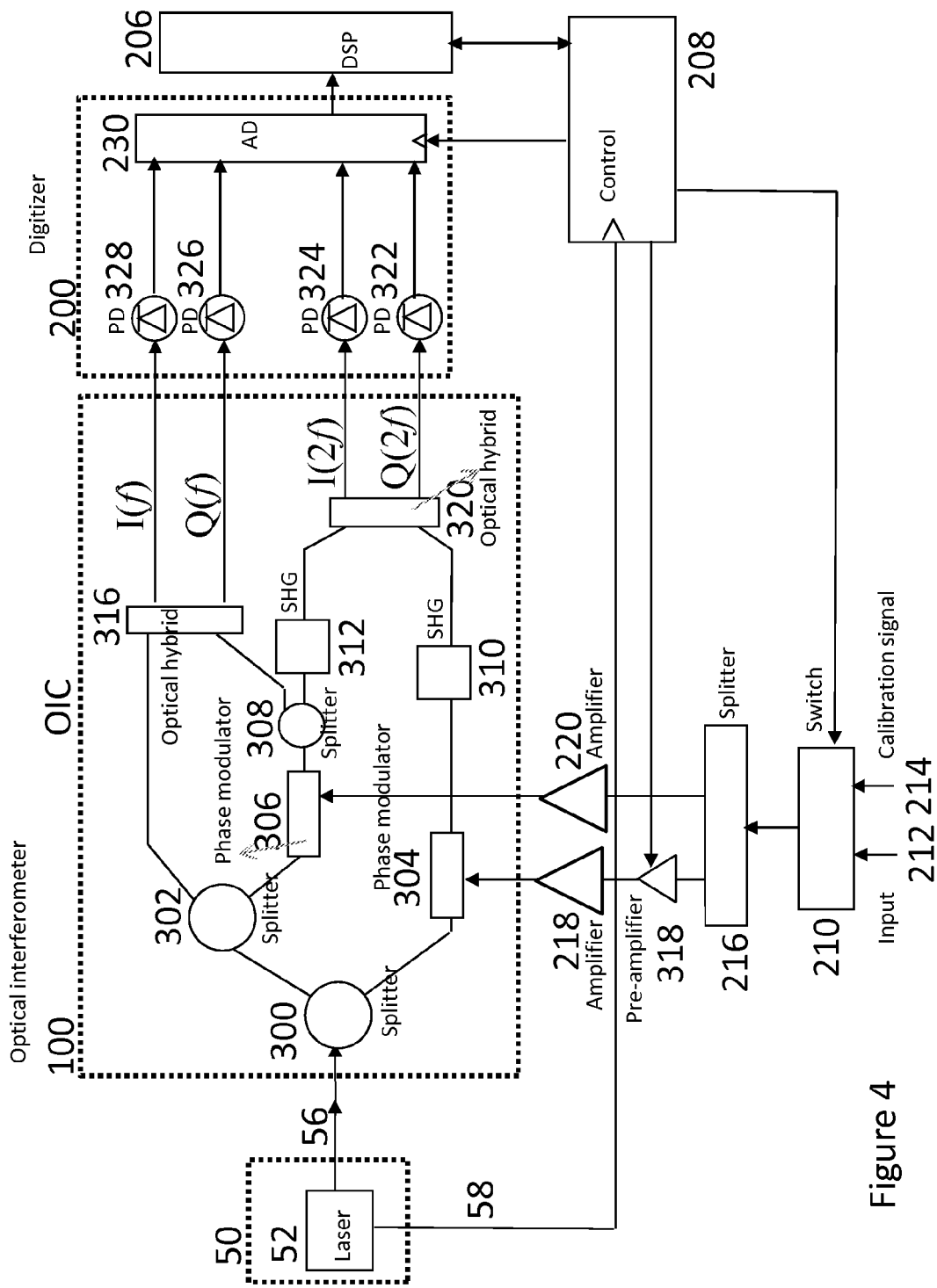
FIG. 4 Three arm push-pull system having outputs at both the fundamental optical frequency and the second-harmonic optical frequency to further improve dynamic range.

An embodiment designed for high dynamic range is shown in FIG. 4. This design also uses multiple output combiners, but this time the differential phase shift at the second harmonic frequency push-pull combiner 320 is enhanced by SHG stages 312,310 while the optical signals prior to the fundamental frequency single-ended combiner 316 are not frequency doubled in SHG stages. Note that the two combiners can be implemented in a single device but their functionality is separated in the diagram for illustrative purposes. We assume the phase modulators are oppositely poled so that the push-pull phase shift is not frequency dependent, although other configurations are possible. The electrical signal driving the common phase modulator 306, the common phase modulator applying a modulation signal that feeds both optical combiners 316,320, has less gain from the input signal 212 to the phase modulator 306 than the electrical signal driving the high sensitivity phase modulator 304 that is exclusively for the push-pull section. This acts to make the magnitude of the phase modulation in each arm unequal and to further enhance the dynamic range as will be described.

FIG. 4 is similar in some regards as FIG. 2 and the differences will be described. The optical pulse source 50 sends pulses to the first optical splitter 300. The first splitter taps off some of the pulse energy to a high sensitivity phase modulator 304. The optical output of the high sensitivity phase modulator is multiplied in a first SHG stage 310 and sent to a second-harmonic frequency push-pull optical hybrid 320. The first optical splitter also sends pulses through a second optical splitter 302. One output of the second optical splitter goes into a common phase modulator 306. The output of the common phase modulator is split in a third optical splitter 308, a portion of the third splitter output is sent to a second SHG stage 312. The output of the second SHG stage is sent to another input port of the second-harmonic frequency push-pull optical hybrid 320. The I and Q outputs of the second-harmonic push-pull optical hybrid 320 are detected by photodetectors 324,322, digitized in a multi-channel ADC 230 and processed in a DSP 206. These samples are processed as the push-pull samples.

One output from the second optical splitter 302 is sent to a fundamental frequency single-ended optical hybrid combiner 316. A portion of the phase modulated output of the common phase modulator 306 is split off by the third optical splitter 308 located before the second SHG stage into the fundamental frequency single-ended optical hybrid combiner 316. The I and Q outputs of the fundamental frequency single-ended optical hybrid combiner are detected by photodetectors 328, 326, digitized in a multi-channel ADC 230 and processed in a DSP 206. These samples are process as the single ended (as opposed to push-pull) samples.

The input signal 212 is split in an electrical splitter 216, with one output of the splitter going to a pre-amplifier 308 followed by a first post-amplifier 218 and the other output of the splitter going directly to a post amplifier 220. The inclusion of the pre-amplifier is for illustration to show that the total amplification from the electrical splitter 216 to the high sensitivity phase modulator 304 is higher than the total amplification from the electrical splitter 216 to the common phase modulator 306, and there may or may not actually be a physical pre-amplifier. The gain of the pre-amplifier can be variable and under the control of the controller 208. For the sake of illustration, we assume each of the post-amplifiers have the same output saturation power, say such that they can output a voltage of up to $2 \cdot V_\pi$. Assume the pre-amplifier is set for a voltage gain of $G_{pre}=2$ and the post-amplifier has a voltage gain of $G_{post}=5$. When the voltage at the two outputs of the electrical splitter are $V_\pi/15$ then the sensitive phase modulator is applying a phase shift of $\frac{2}{3} V_\pi$ and the common phase modulator is applying a phase shift of $\frac{1}{3} V_\pi$. Thus the total differential phase shift is $V_\pi$. The SHG stages effectively double the differential phase shift resulting in a full 2π phase modulation at the second-harmonic frequency push-pull optical hybrid 320. This represents the highest input voltage that the push-pull interferometer could handle when operating alone due to the 2π phase ambiguity of the interferometer. However, the single ended interferometer only has a phase shift of $\frac{1}{3} V_\pi$. Thus the 2π phase ambiguity can be cleared up even for input signals that are increased by a factor of 6 by using the single-ended interferometer. For large signals the single ended interferometer could be used alone, or provided the push-pull interferometer is still operating in a linear regime (amplifier not saturated) both interferometers could be used with the single ended interferometer monitored in order to clear up ambiguities while the push-pull interferometer samples are used for high resolution sampling. A factor of 6 in voltage increases the dynamic range by >15 dB. By changing the gain of the pre-amplifier to a higher level even wider dynamic ranges can be obtained since smaller input signals are measureable. A higher pre-amplifier gain level will cause the push-pull interferometer to saturate for smaller input voltage levels however. Thus it can be beneficial for the pre-amplifier gain to be varied based on the size of the input signal. Because the push-pull and single-ended interferometers operate together, the inclusion of a calibration signal 214 is useful to accurately calibrate their relative input-signal-to-phase-shift conversion, especially when the pre-amplifier has a variable gain. Note that instead of different gain levels the optical modulators 306,304 could instead have had different $V_\pi$ specifications. As long as the resulting phase modulations in the two optical modulators are of different magnitude a larger dynamic range can be obtained.

Figure 5:
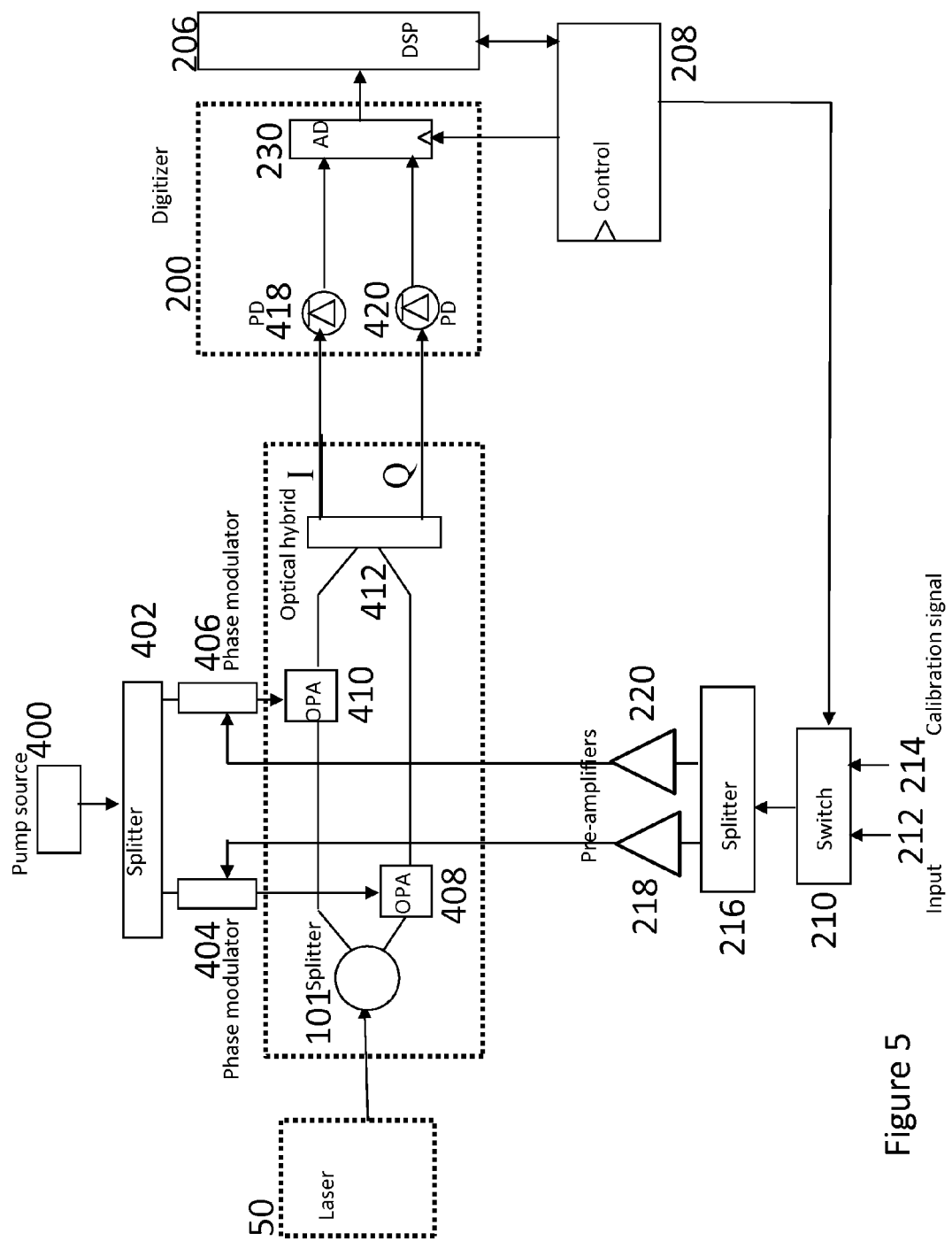
FIG. 5 Push pull configuration created by phase modulating in opposite directions the two pumps that pump two different parametric amplifiers located inside the optical interferometer.

Another embodiment is shown in FIG. 5, where here phase conjugation via a parametric amplifier is used to apply a phase shift and allow for push-pull operation. A pulsed pump source 400 is split in a pump optical splitter 402 to pump two parametric amplifiers 408,410 as might be realized using the nonlinearity in optical fiber or the nonlinearity in a periodically poled lithium niobate waveguide. The optical source 50 can in this case be a continuous wave (CW) laser as it will become effectively pulsed after amplification by the pulsed pump parametric amplifiers. Pulsing the pumps is advantageous as high peak pump power levels are needed for nonlinear interactions such as parametric amplification. Short pump pulses allow high peak powers with low average powers for low duty cycles. A 5 ps pump pulse at 1 GHz repetition rate can have a peak power approximately 200× its average power level. Both outputs of the pump splitter are modulated in separate phase modulators 404,406. For simplicity we assume the phase modulators are oppositely poled and driven with identical input signals from the amplified output of the electrical splitter 216, thus the two pumps are push-pull phase modulated although other methods of creating push-pull modulation can also be used. The pumps drive their respective parametric amplifiers 408,410 that are inside the arms of the interferometer. The parametric amplifiers amplify the signal from the optical source and simultaneously generate an idler output of a different wavelength. A filter inside the parametric amplifiers sends the idler outputs to the hybrid combiner 412. The idlers carry a phase modulation twice as large as the phase modulation on the pumps. Thus, the pump phase modulators only need to apply a phase shift of up to $\pi/2$ in order to generate a full $2\pi$ phase shift in the interferometer. The optical signals out of the hybrid combiner 412 are detected by photodetectors 418,420, digitized by an ADC 230, and the digital samples are process in a DSP 206 in order to determine the digitized input signal samples.

Figure 6:
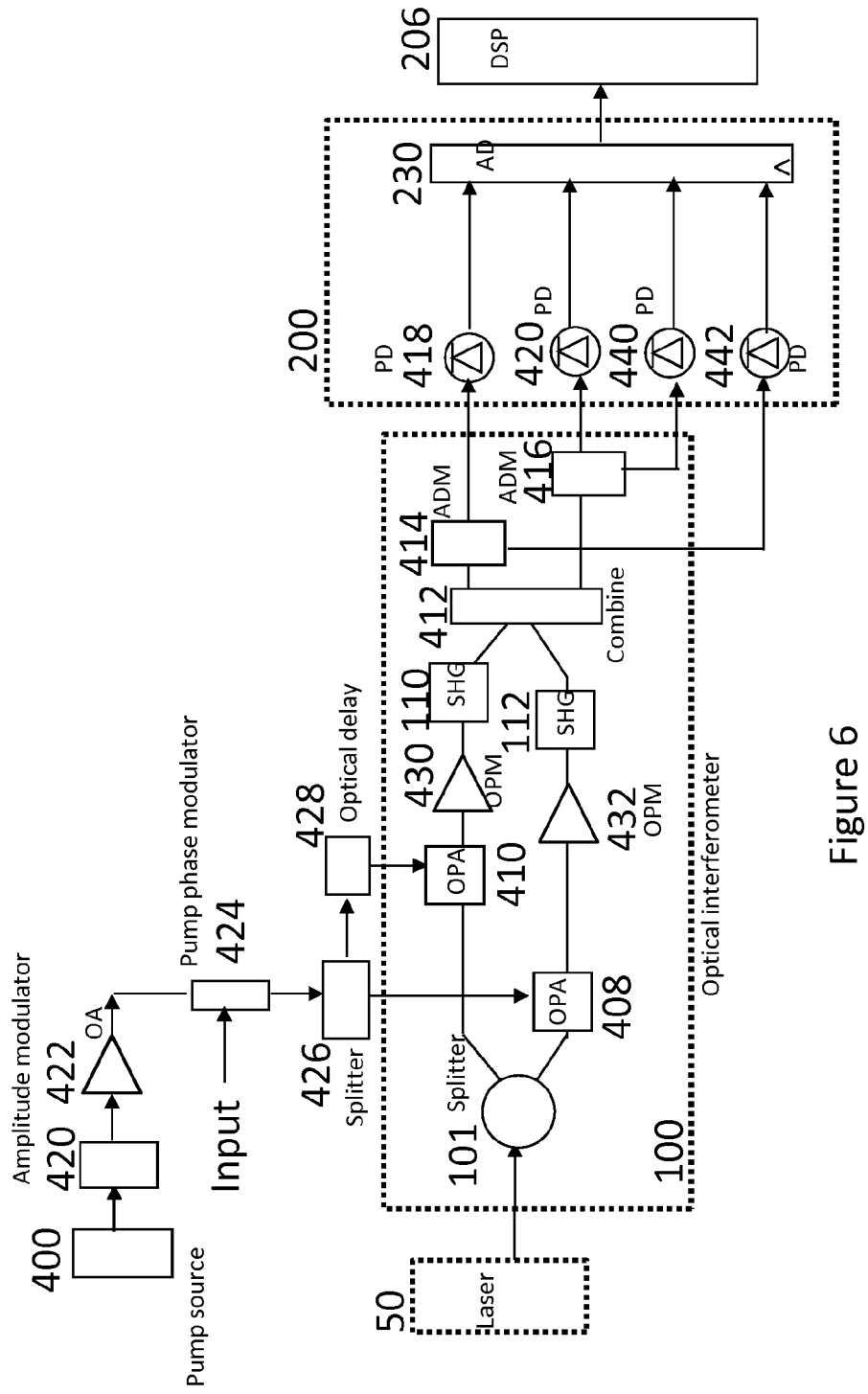
FIG. 6 Parametric-amplifier based push-pull sampling configuration using a single phase modulator by appropriately delaying one of the pumps to its respective parametric amplifier.

A modified implementation is shown in FIG. 6 that uses just a single pump phase modulator 424 to modulate both pumps. In this embodiment the optical source 50 is pulsed with a 1 GHz pulse rate and 5 ps pulses while the pump optical source 400 is CW. An amplitude modulator 420 chops the pump into 50 ps 1 GHz pulses matched to the optical source pulse rate. The chopped pump is amplified in an optical amplifier 422 such as an Erbium doped fiber amplifier. Such amplifiers do not depend on the phase of the input signal and are thus phase-insensitive amplifiers. This chopping process allows a small average power amplifier, such as a 100 mW amplifier, to generate high peak powers of >1 W to pump the parametric amplifier. The pump is phase modulated in a single pump phase modulator 424 by the input signal. A pump splitter 426 splits the pump into two outputs. One output is delayed by a short delay element 428, which can be realized by a short added length of optical fiber, before it pumps one of the parametric amplifiers 410. The short delay element can be a delay of 10 ps, although more generally a variable delay line can be used so the delay level can be changed as desired. The other output from the pump splitter pumps the other parametric amplifier 408. Assuming the 5 ps optical source pulses reach each of the parametric amplifiers at the same time, the respective pump signals are delayed by 10 ps. Thus the phase modulation carried by each of the pumps differs by 10 ps, which is ½ of a wavelength for a 50 GHz input signal. Thus, if the input signal is near 50 GHz then the two pumps will generate phase modulations on the generated idler wavelengths in a push-pull mode. We note that instead of the short delay on one of the pumps the system could have been designed with matching pump lengths by adding a short optical delay before the phase shifter in one interferometer arm and an equal short optical delay after the phase shifter in the other interferometer arm, as was done in the embodiment of FIG. 2. In this case the pump arrives at both parametric amplifiers at the same time, but the short source pulses arrive at slightly different times. In either case the push-pull phase modulation experienced at the nominal operating frequency can still be viewed as due to the relative optical propagation delay between the two pumps, with delays inside the interferometer simply changing the relationship between the relative pump optical propagation delay and the resulting nominal operating frequency. In either case the total optical delay the source pulses experience is the same in both interferometer arms so that the short pulses can interfere at the output combiner 412 and the use of delay elements forces the phase shifts applied by the parametric amplifiers to be in a push-pull mode at a given nominal operating frequency.

After the parametric amplifiers additional optical amplifiers 430,432 such as phase insensitive semiconductor optical amplifiers (SOAs) amplify the idler pulses. These amplifiers are optional and are used to reduce the required gain of the parametric amplifiers and thereby reduce the required peak pump power of the pump. After the optical amplifiers SHG stages 110,112 frequency double the idler output thereby also doubling the differential phase shift. If the pump phase modulator applies a sinusoidal phase shift of $V_\pi/8 \cos(2\pi f_e t)$ then at $f_e=50$ GHz the differential phase between the pumps at the parametric amplifiers are $V_\pi/4 \cos(2\pi f_e t)$ due to the push pull action from the delay elements. The parametric amplifiers transfer 2× the phase shift of the pump to the idler, leaving a $V_\pi/2 \cos(2\pi f_e t)$ differential phase shift. After the SHG stages this becomes $V_\pi \cos(2\pi f_e t)$, which is a full $2V_\pi$ range for the differential phase shift of the interferometer. The phase shift applied by the phase modulator has thus been effectively increased in magnitude by a factor of 2×2×2=8, which is a magnification of over 18 dB in terms of required input signal power. No electrical amplifiers are shown in FIG. 6, as this magnification is assumed to be enough to substitute for electrical gain.

Add-drop multiplexers (ADMs) 414,416 are located after the optical hybrid combiner 412. The ADMs drop the amplified optical signal frequency (the amplified optical signal frequency is allowed to pass out of the parametric amplifiers along with the generated idler frequency in this embodiment) to photodetectors 440,442. This amplified optical signal frequency is not phase modulated by the pump, but can be used to monitor changes in the parametric amplifier gain and in the bias phase of the interferometer. The idler is passed from the ADMs to photodetectors 418,420. The photodetector outputs are sampled in an ADC and sent to a DSP for processing to determine the digitized input signal samples.

The configuration of FIG. 6 can be used for antenna remoting, where only the pump phase modulator 424 is located near the antenna. All the other components can be remotely located and inter-connected with the pump phase modulator via optical fiber cable. Common phase shifts on the pump pulses traveling from the pump phase modulator to the interferometer will cancel out provided they are <<50 GHz. Thus even though the applied pump phase modulation is transferred to the interferometer the system can be stable. With 18 dB of effective gain there are many cases where no electrical amplifier will be required at the antenna, thereby making the system highly flexible since the operating frequency is not determined by the amplifier bandwidth and also removes the requirement for electrical power at the antenna site. The optical delay element 428 can be realized with a variable delay line so that the optimal push-pull operating frequency can be tuned. A similar remoteing function can be performed by other embodiments, including the embodiment of FIG. 2. However in FIG. 2 does not have as much effective gain and as depicted would have one fiber link to the interferometer at the remote site and four fiber links out of it. The design of FIG. 6 can have just one fiber link in and one fiber link out of the remote site. Additional interferometer arms can be added to the parametric amplifier based systems to increase dynamic range if desired.

[1] George C. Valley, "Photonic analog-to-digital converters," Opt. Express 15, 1955-1982 (2007)
[2] Twichell et al, U.S. Pat. No. 5,955,875.
[3] Kanter et al. US Patent Application #20120212360
[4] F. Lucchi et al., "Very low voltage single drive domain inverted LiNbO3 integrated electro-optic modulator," Optics Express 15, 10739-10743 (2007).
[5] *Fiber Optical Parametric Amplifiers, Oscillators and Related Devices* by Michel E. Marhic, Cambridge University Press 2008.

What is claimed is:

1. An apparatus for modulating an optical signal with an input electrical signal, comprising:
   an optical interferometer that splits an input optical beam of mean optical frequency f into at least two arms, a first arm including a phase modulator modulating according to the input electrical signal the optical beam,
   a first frequency converter receiving an output of the phase modulator and multiplying the optical frequency f to a higher frequency n·f where n is a multiplication term;
   a second arm including a second frequency converter multiplying the optical frequency f to a higher frequency n·f where n is a multiplication term;
   an optical combiner that combines the two arms of the interferometer into at least one optical output signal, and wherein the frequency converter also acts to multiply the applied phase shift from the phase modulator thus providing a performance improvement by reducing a minimum detectable electrical input signal size.

2. The apparatus of claim 1 wherein the frequency converter is a second harmonic generator (SHG) with n=2.

3. The apparatus of claim 1, wherein said at least one modulated optical output signal from the optical combiner is detected by at least one photodetector, the photodetector electrical output signal is digitized by an analog-to-digital-converter (ADC), the digitized ADC samples of the output signal of the photodetector are sent to a digital signal processor (DSP), the DSP processing the digital ADC samples so as to reconstruct the digitized electrical input signal samples, thereby outputting the sampled and digitized input electrical signal.

4. The apparatus of claim 3, further comprising:
   a second phase modulator located before the second frequency converter, the optical output of the second phase modulator being connected to the input of the second frequency converter, wherein the second phase modulator applies a phase shift of opposite sign as the first phase modulator in response to the input electrical signal when the phase shift is defined at the optical output combiner, the interferometer thereby operating in a push-pull mode, a differential phase shift generated in the two arms of the interferometer causing interference in the optical combiner outputs, and wherein the push-pull mode lowers the voltage required at the phase modulators to obtain a fixed differential phase shift in the interferometer.

5. The apparatus of claim 4, wherein
   the interferometer is configured to operate at both f and n·f frequencies thus expanding the usable dynamic range of the apparatus, with the signal at n·f having better sensitivity while the signal at f has a larger unambiguous input signal range therefore improving the overall dynamic range.

6. The apparatus of claim 4, further comprising:
   a first optical delay element before the first phase modulator;
   a second optical delay element after the second phase modulator;
   the first and second optical delay elements configured so that the overall optical path length in the first and second arm of the interferometer are equal;
   the first delay element delaying the phase modulation induced by the first phase modulator with respect to the phase modulation induced by the second phase modulator such that when the input electrical signal is at a nominal operating frequency then the induced phase shift in the first and second arm of the interferometer are of opposite phase at the optical output combiner and whereas the induced phase shifts in the first and second arm of the interferometer approach the same phase as the input electrical signal approaches zero Hertz, the delay elements thereby causing the interferometer to operate in push-pull mode thereby applying a maximal optical modulation when the input electrical signal is near the nominal operating frequency while the interferometer applies a minimal optical modulation for very low input electrical signal frequencies.

7. An apparatus for modulating an optical signal with an input electrical signal, comprising:
   an optical interferometer that splits an optical beam into at least two interferometer arms, the first interferometer arm including a first optical delay element, the output of the first delay element connected to a first phase modulator, the first phase modulator modulating the phase of the optical beam propagating in the first interferometer arm according to the input electrical signal, the optical output of the first phase modulator connected to a first input port of a first optical output combiner;
   the second interferometer arm including a second phase modulator, second phase modulator modulating the phase of the optical beam propagating in the second interferometer arm according to the input electrical signal, the optical output of the second phase modulator being connected to a second optical delay element, the output of the second delay element being connected to a second input port of the first optical output combiner;

the phase modulators modulating the phase of the optical beams propagating through them according to an input electrical signal;

the delay values of the first and second optical delay elements selected so that the overall optical path length in the first and second interferometer arms are equal;

the optical output of the first optical output combiner being intensity modulated in relation to the differential phase shift induced between the two arms of the interferometer input to the first optical combiner; whereas the inclusion of the optical delay elements allows the differential phase shift in response to the input electrical signal to be frequency dependent where the differential phase shift is maximized when the input electrical signal is at a nominal operating frequency and the differential phase shift decreases as the input electrical signal frequency decreases below the nominal operating frequency.

8. The apparatus of claim 7, wherein the first and second optical delay elements are variable delay elements;

the values of the variable delay elements determining the nominal operating frequency.

9. The apparatus of claim 7, further comprising;

a first photodetector detecting a first output of the first optical combiner;

a second photodetector detecting a second output of the first optical combiner;

the first and second photodetector electrical outputs being sampled and digitized in an ADC;

the digitized samples from the ADC being sent to a DSP;

the DSP processing the digitized samples to determine a first set of digitized samples of the electrical input signal; and whereas the size of the digitized input electrical signal is dependent in part on the frequency of the electrical input signal.

10. The apparatus of claim 9, further comprising:

the first and second optical delay elements being variable delay elements;

the values of the variable delay elements determining the nominal operating frequency;

a control unit that receives from the DSP an estimate of the size of the digitized input electrical signal, the control unit controlling the value of the optical delay in the variable optical delay elements;

and whereas the control unit selects a delay size in order to maximize the size of the digitized input electrical signal.

11. The apparatus of claim 9, further comprising;

a third interferometer arm, a portion of the optical beam propagating through the third interferometer arm, the third interferometer arm being connected to the first input port of a second optical combiner;

a splitter after the second phase modulator sending a fraction of the splitter input optical beam to a second input port of the second optical combiner;

the optical output ports of the second optical combiner being detected in a third and fourth photodetector, the third and fourth photodetector outputs being sampled and digitized in ADCs, the resulting digitized ADC samples being sent to the DSP, the DSP processing the resulting digitized samples to determine a second set of digitized samples of the input electrical signal;

the size of the second set of digitized samples being relatively insensitive to the electrical input frequency relative to the size of the first set of digitized samples.

12. The apparatus of claim 11, wherein the DSP compares the magnitude of the first and second set of digitized input electrical signal samples;

and whereas the different frequency responses of the two sample sets is used in part to obtain information on the frequency of the input electrical signal.

13. An apparatus for sampling and digitizing an electrical input signal, comprising:

an optical interferometer with at least three arms, wherein at least two of the arms out of these three arms contain phase modulators, the phase modulators being driven with the electrical input signal, the phase modulators applying push-pull phase shifts of opposite sign for a given electrical input signal, the push-pull arms being combined in a first optical combiner;

the interferometer also containing a third arm, the third arm applying a smaller optical modulation in the range from 0 to ½ the size of the optical phase modulation in the push-pull arms, the third arm being combined with one of the other arms in a second optical combiner;

the first and second optical combiner outputs being detected with photodetectors, the photodetector outputs being sampled in ADCs, the ADC outputs being processed by a DSP to calculate the corresponding digital samples of the electrical input signal, whereas the use of three or more arms allows for a wider input signal dynamic range.

14. The apparatus of claim 13, whereas a magnitude of the phase modulation applied by the phase modulators in the push-pull interferometer arms in response to an input electrical signal is unequal, with the arm applying the smaller phase modulation magnitude being connected to both the first and second optical combiner, thereby further increasing an input signal dynamic range.

15. The apparatus of claim 13, further comprising;

a first optical delay element before the phase modulator in one arm of the interferometer and a second optical delay element after the phase modulator in the other arm of the interferometer;

the inclusion of the delay elements causing the differential phase shifts at the first optical combiner to be maximized when the input electrical frequency is at a nominal operating frequency and where the differential phase shift continues to decreases as the input electrical frequency decreases below the nominal operating frequency;

and whereas the overall optical path delay of the interferometer arms connected to the first optical combiner are equal and the overall optical path delay of the interferometer arms connected to the second optical combiner are equal.

16. An apparatus for modulating an optical beam with an electrical input signal comprising:

an optical interferometer splitting an input optical beam into at least two arms; the first arm comprised of a first parametric amplifier pumped by a first optical pump beam, the idler wavelength generated in the first parametric amplifier being sent to a first input port of an optical combiner;

the second arm comprised of a second parametric amplifier pumped by a second optical pump beam, the idler wavelength generated in the second parametric amplifier being sent to a second input port of the optical combiner;

the output of the optical combiner being the modulated optical beam;

a pump phase modulator modulating according to the electrical input signal the first pump signal prior to the first parametric amplifier, the first parametric amplifier thereby transferring the phase modulation on the first pump signal to the generated idler wavelength with a factor of two increase in the magnitude of the phase modulation, the parametric amplifiers thereby reducing the required voltage to the pump phase modulator to achieve a given differential phase shift in the interferometer.

17. The apparatus of claim 16, whereas the pump beams that pump each optical parametric amplifier are both phase modulated such that the phase shifts transferred to the resulting idler wavelengths are of opposite polarity at the optical combiner, the opposite polarity of the induced idler phase modulation thereby improving a sensitivity of the apparatus for small input signals.

18. The apparatus of claim 17, wherein the opposite polarity of the induced idler phase modulation is created at a given nominal input signal frequency by setting the relative optical propagation delay between the pumps and their respective parametric amplifiers such that at a nominal electrical input signal frequency the induced idler phase modulations are approximately out-of-phase at the optical combiner, whereas near a zero Hertz electrical input signal frequency the induced idler phase modulations are approximately in-phase.

19. The apparatus of claim 18, wherein both pumps are modulated in the same electro-optical phase modulator.

20. The apparatus of claim 16, further comprising: phase insensitive optical amplifiers located in the optical interferometer after the parametric amplifiers in order to reduce a required gain in the parametric amplifiers and therefore reducing the required pump power.

21. The apparatus of claim 16, further comprising: a first frequency converter located after the first parametric amplifier in the first arm of the optical interferometer and a second frequency converter located after the second parametric amplifier in the second arm of the optical interferometer, the frequency converters multiplying the optical frequency and phase of the idler outputs of the parametric amplifiers thus also multiplying the induced differential phase shift at the optical combiner and therefore improving a sensitivity of the apparatus.

22. The apparatus of claim 16, further comprising: one or more photodetectors detecting the one or more outputs of the optical combiner;
the electrical outputs of the photodetectors being sampled and digitized in an ADC;
the digitized samples from the ADC being sent to a DSP;
the DSP processing the digitized samples to determine digitized samples of the electrical input signal; thereby outputting a sampled and digitized version of the input electrical signal.

23. The apparatus of claim 19, wherein the relative optical delay is realized in a variable delay line, thus allowing the nominal input signal frequency to be modified by changing the variable delay value.

24. An apparatus for modulating a pulsed optical signal with an input electrical signal, comprising:
an optical interferometer that splits an optical pulse into at least two interferometer arms, the first interferometer arm including a first optical delay element that delays the optical pulse by a time $\tau$, the output of the first delay element connected to a first spatial mode of a phase modulator, the output of the first spatial mode of the phase modulator connected to a first input port of a first optical output combiner;
the second interferometer arm being connected to a second spatial mode of the phase modulator, the output of the second spatial mode of the phase modulator connected to a second delay element that delays the optical pulse by a time $\tau$, the output of the second delay element connected to a second input port of a first optical output combiner;
the phase modulator modulating the phase of the optical beam propagating in both spatial modes according to the input electrical signal where at any given time both spatial modes experience the same phase modulation; the overall optical path length in the first and second interferometer arms being equal so the optical pulses from the first and second arms interfere at the output of the optical output combiner; whereas the inclusion of the optical delay elements creates a maximum differential phase shift in response to an input electrical signal at frequency of $1/(2\cdot\tau)$ and a nearly zero differential phase shift in response to an input electrical signal that is at a frequency near 0 Hertz.

* * * * *